(12) United States Patent
Suyama

(10) Patent No.: US 6,738,444 B1
(45) Date of Patent: May 18, 2004

(54) APPARATUS AND METHOD OF GENERATING CLOCK SIGNAL

(75) Inventor: Akinori Suyama, Fujisawa (JP)

(73) Assignee: Victor Company of Japan, Ltd., Yokohama (JP)

(*) Notice: Subject to any disclaimer, the term of this patent is extended or adjusted under 35 U.S.C. 154(b) by 645 days.

(21) Appl. No.: 09/656,168

(22) Filed: Sep. 6, 2000

(30) Foreign Application Priority Data

Sep. 6, 1999 (JP) ............................................. 11-251096

(51) Int. Cl.[7] .............................................. H03D 3/24
(52) U.S. Cl. ...................... 375/376; 375/373; 375/354; 375/355; 375/327
(58) Field of Search ....................... 327/156; 369/47.39; 375/376, 120, 348, 259, 355, 371, 324, 350, 354, 373, 327; 331/1; 360/51; 370/466

(56) References Cited

U.S. PATENT DOCUMENTS

| | | | |
|---|---|---|---|
| 4,360,926 A | 11/1982 | Hedin et al. | 375/120 |
| 5,018,170 A * | 5/1991 | Wilson | 375/376 |
| 5,625,506 A | 4/1997 | Dovek et al. | 360/51 |
| 5,671,201 A * | 9/1997 | Yokota et al. | 369/47.39 |
| 5,907,253 A * | 5/1999 | Davis et al. | 327/156 |

FOREIGN PATENT DOCUMENTS

| | | |
|---|---|---|
| DE | 4102800 A1 | 8/1992 |
| DE | 19717642 A1 | 11/1998 |
| JP | 07122996 | 5/1995 |
| JP | 11185395 | 7/1999 |

* cited by examiner

*Primary Examiner*—Stephen Chin
*Assistant Examiner*—Ted Wang
(74) *Attorney, Agent, or Firm*—Jacobson Holman PLLC

(57) ABSTRACT

A clock signal generating apparatus has a phase-lock loop circuitry. A phase comparator compares, in phase, an input digital signal with a clock signal that has already been generated. A differential amplifier amplifies the difference between the output of the phase comparator and a reference voltage. A clock signal generator generates a clock signal to be supplied to the phase comparator, based on the amplified difference. An accumulator accumulates an amount of errors of the input digital signal. A voltage generator generates a reference voltage to be supplied to the differential amplifier within a range from a predetermined minimum voltage to a predetermined maximum voltage. The level of the generated reference voltage is adjusted according to the output of the accumulator. The operating point of the clock signal generator is controlled by the level-adjusted reference voltage.

4 Claims, 3 Drawing Sheets

APPARATUS AND METHOD OF GENERATING CLOCK SIGNAL

BACKGROUND OF THE INVENTION

The present invention relates to clock signal generation. Particularly, this invention relates to clock signal generation with error-correction of input digital signals.

Digital video tape-recorders (VTRS) have a clock signal generator in the reproduction circuitry.

In clock signal generation, a signal reproduced from a storage medium is differentiated and transformed into a binary digital signal. The digital signal is compared in phase with a clock signal that has been generated. The difference between the comparison result and a reference voltage is used for controlling frequency oscillation to generate a clock signal. The generated clock signal is compared with the digital signal in a phase-lock loop circuitry.

The reference voltage is adjusted so that a oscillated frequency arrives at an average frequency of the digital signal.

The reference voltage, however, has been manually adjusted; and hence there is a demand for non-manually adjustable reference voltage regulation.

Moreover, such a manually-adjusted reference voltage will vary with time or temperature change to affect the performance of the phase-lock loop circuitry.

SUMMARY OF THE INVENTION

A purpose of the present invention is to provide an apparatus and a method of clock signal generation with no manual adjustments of a reference voltage supplied to a phase-lock loop circuitry, and almost no degradation of performance with time.

The present invention provides an apparatus for generating a clock signal including: a phase comparator to compare, in phase, an input digital signal with a clock signal that has already been generated; a differential amplifier to amplify the difference between the output of the phase comparator and a reference voltage; a first generator to generate a clock signal to be supplied to the phase comparator, based on the amplified difference; an accumulator to accumulate an amount of errors of the input digital signal; and a second generator to generate a reference voltage to be supplied to the differential amplifier within a range from a predetermined minimum voltage to a predetermined maximum voltage, a level of the generated reference voltage being adjusted according to the output of the accumulator, an operating point of the first generator being controlled by the level-adjusted reference voltage.

Moreover, the present invention provides a method of generating a clock signal. An input digital signal is compared in phase with a clock signal that has already been generated. The input digital signal is generated based on the clock signal. The difference between the comparison result and a reference voltage is amplified. A clock signal to be supplied for the comparison is generated based on the amplified difference. An amount of errors of the input digital signal is accumulated. The amount of errors depends on the comparison result in phase. A reference voltage to be supplied for the amplification is generated within a range from a predetermined minimum voltage to a predetermined minimum voltage. The level of the generated reference voltage is adjusted based on the accumulated errors. The operating point for the clock signal generation is controlled by the level-adjusted reference voltage.

DETAILED DESCRIPTION OF PREFERRED EMBODIMENTS

A preferred embodiment according to the present invention will be disclosed with reference to the attached drawings.

Figure 1:
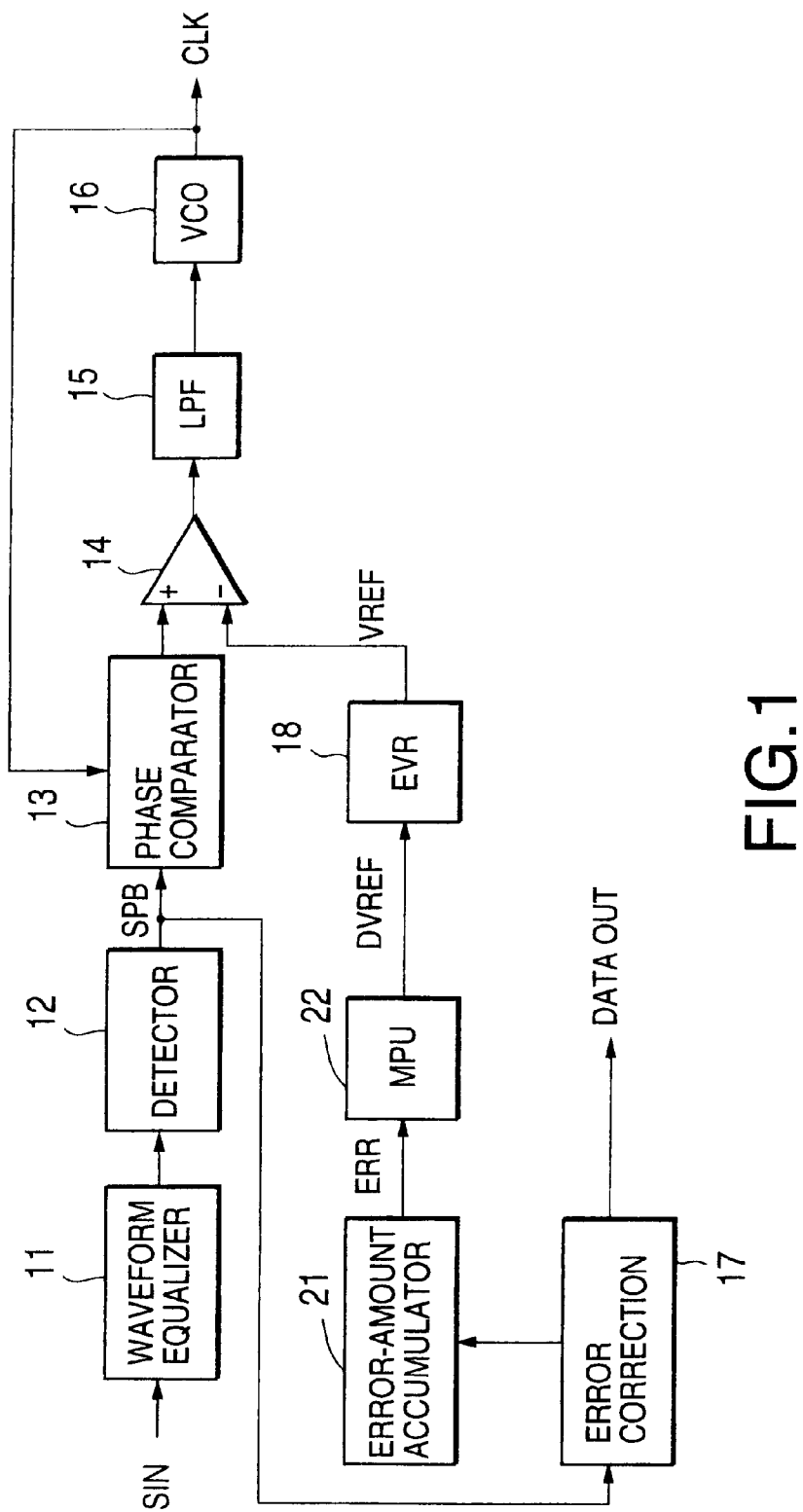
FIG. 1 shows a block diagram of a preferred embodiment of a clock signal generating apparatus according to the present invention.

FIG. 1 shows a block diagram of a preferred embodiment of a clock signal generating apparatus according to the present invention.

In FIG. 1, a differentiated-waveform signal SIN of an edge portion of a signal reproduced from a storage medium via magnetic head (both not shown) is supplied to a waveform equalizer 11.

The output of the equalizer 11 is supplied to a detector 12 for transforming the output into a binary digital signal SPB (called a reproduced SPB signal hereinafter).

The reproduced SPB signal is supplied to a phase comparator 13 that compares the reproduced SPB signal with a clock signal CLK.

The output of the phase comparator 13 is supplied to a differential amplifier 14 that amplifies the difference between the comparator output and a reference voltage VREF supplied by an electrically-variable resistor (EVR) 18.

The output of the differential amplifier 14 is supplied to a low-pass filter (LPF) 15 for removing high frequency components of the differential output.

The output of the LPF 15 is supplied to a voltage-controlled oscillator (VCO) 16 that generates a clock signal CLK which is used as a reference clock signal for a digital VTR including the detector 12 and an error correction circuit 17 for accurately sampling "0" and "1" of the reproduced SPB signal. The clock signal CLK is also fed back to the phase comparator 13.

The reproduced SPB signal of the detector 12 is further supplied to the error correction circuit 17 that outputs error-corrected data and also supplies an amount of errors (the number of times of occurrence of errors) to an error-amount accumulator 21.

The error-amount accumulator 21 accumulates the amount of errors for a predetermined period to output an accumulated-error signal ERR.

The signal ERR is supplied to a microprocessor (MPU) 22. In response to the signal ERR, the MPU 22 generates a reference voltage data DVREF.

The data DVREF is supplied to the EVR 18. In response to the data DVREF, the EVR 18 generates a reference voltage VREF within a range from a predetermined minimum voltage VMIN to a predetermined maximum voltage VMAX. The reference voltage VREF is used for adjusting an operating point of the VCO 16, or the center of the frequency oscillated by the VCO 16 so that the oscillated frequency reaches an average frequency of the reproduced SPB signal.

The phase comparator 13, the differential amplifier 14, the LPF 15 and the VCO 16 constitute a phase-lock loop circuit where the reproduced signal SPB is phase-locked with the clock signal CLK.

Figure 2:
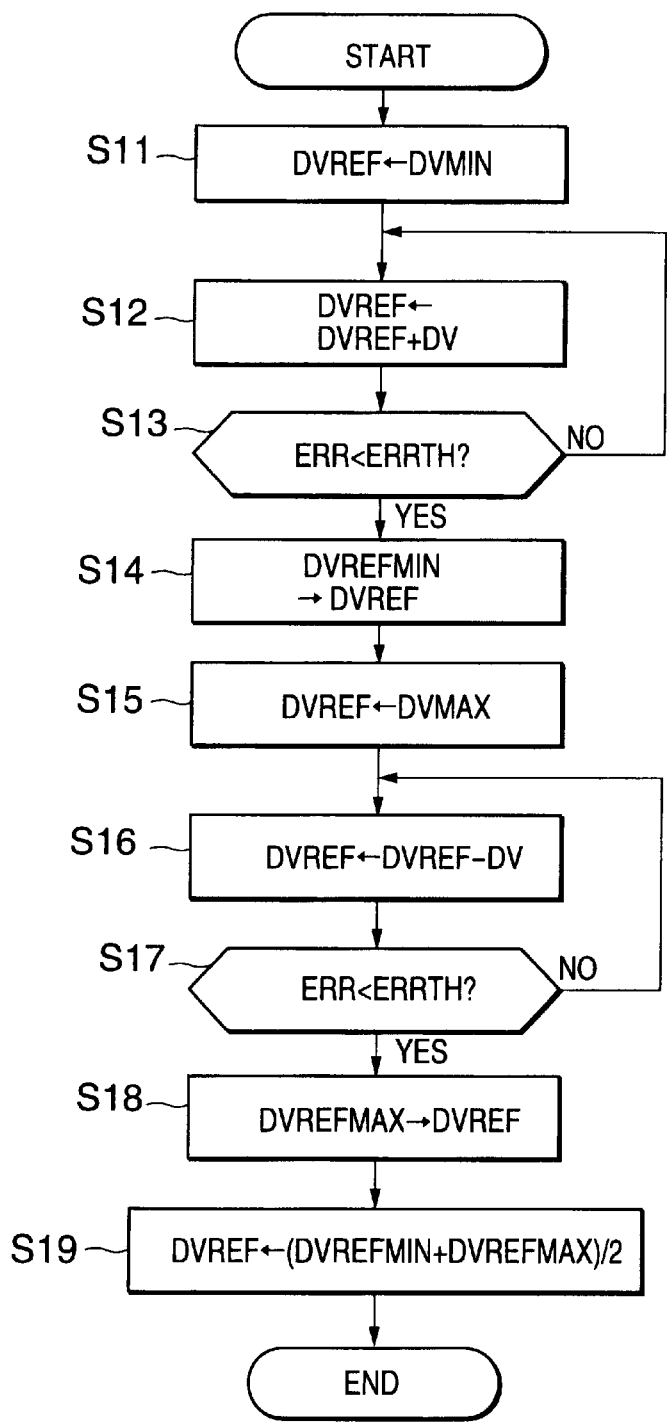
FIG. 2 is a flow chart explaining reference voltage settings.

The MPU 22 executes the process shown in FIG. 2, for reference voltage data DVREF settings. The term "data" in the following disclosure means a digital signal.

In STEP S11, the reference voltage data DVREF is set at data DVMIN that corresponds to the minimum voltage VMIN which is the minimum voltage the EVR 18 can generate. The data DVREF is increased by a predetermined amount DV in STEP S12.

Figure 3:
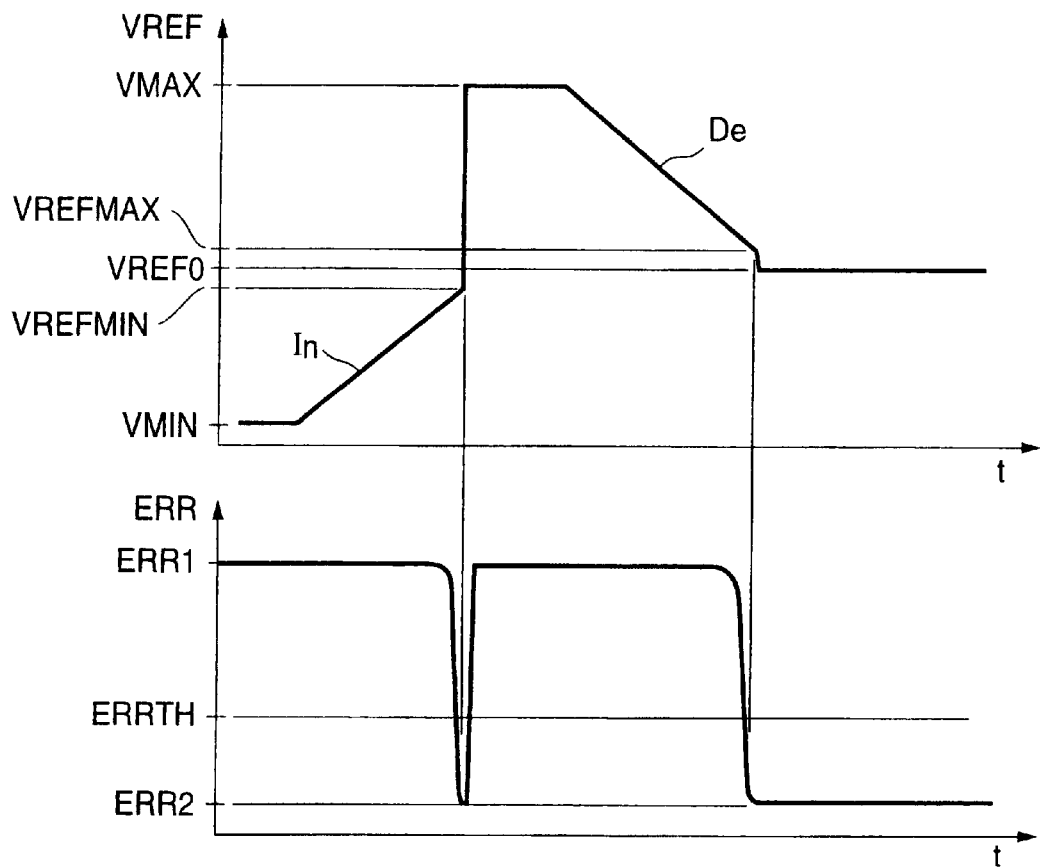
FIG. 3 shows graphs indicating transition of a reference voltage and an accumulated error of a reproduced signal.

At the initial stage, the reference voltage VREF output by the EVR 18 is almost the minimum voltage VMIN, as shown in FIG. 3, and a reproduced SPB signal is not phase-locked with the clock signal CLK because the reference voltage data DVREF has been set at the data DVMIN corresponding to the minimum voltage VMIN. This results in generation of an inaccurately reproduced signal SPB. Such an inaccurately reproduced signal SPB produces a relatively large accumulated-error ERR1 as the accumulated-error signal ERR, as shown in the lower graph of FIG. 3.

It is determined in STEP S13 whether the accumulated-error signal ERR is smaller than the threshold level ERRTH.

If the signal ERR is equal to or larger than the level ERRTH, the process returns to STEP S12 for increasing the reference voltage data DVREF by the amount DV repeatedly, as shown as the linear curve In in FIG. 3, until the reproduced signal SPB is phase-locked with the clock signal CLK.

On phase-locking, the accumulated-error signal ERR (ERR1) abruptly reduces to reach the level ERR2 with almost no errors, as shown in the lower graph of FIG. 3.

In STEP S13, when the signal ERR (ERR2) is judged as being smaller than threshold level ERRTH, the process goes to STEP S14.

In STEP S14, the reference voltage data DVREF is set at the minimum reference voltage data DVREFMIN.

The process goes to STEP S15 where the reference voltage data DVREF is set at data DVMAX that corresponds to the maximum voltage VMAX which is the maximum voltage the EVR 18 can generate. The data DVREF is decreased by the predetermined amount DV in STEP S16.

At the initial stage, the reference voltage VREF output by the EVR 18 is almost the maximum voltage VMAX, as shown in FIG. 3, and a reproduced SPB signal is not phase-locked with the clock signal CLK because the reference data DVREF has been set at the data DVMAX corresponding to the maximum voltage VMAX. This results in generation of an inaccurately reproduced signal SPB. Such an inaccurately reproduced signal SPB produces a relatively large accumulated-error ERR1 as the accumulated-error signal ERR, as shown in the lower graph of FIG. 3.

It is determined in STEP S17 whether the accumulated-error signal ERR is smaller than the threshold level ERRTH.

If the signal ERR is equal to or larger than the level ERRTH, the process returns to STEP S16 for decreasing the reference voltage data DVREF by the amount DV repeatedly, as shown as the linear curve De in FIG. 3, until the reproduced signal SPB is phase-locked with the clock signal CLK.

On phase-locking, the accumulated-error signal ERR (ERR1) abruptly reduces to reach the level ERR2 with almost no errors, as shown in the lower graph of FIG. 3.

In STEP S17, when the signal ERR (ERR2) is judged as being smaller than the threshold level ERRTH, the process goes to STEP S18.

In STEP S18, the reference voltage data DVREF is set at the maximum reference voltage data DVREFMAX.

In STEP S19, the reference voltage data DVREF is set at the average value of the minimum and the maximum reference voltage data DVREFMIN and DVREFMAX, and the process ends.

Through this process, the reference voltage VREF is set at an average voltage VREF0 that corresponds to the average value of the minimum and the maximum reference voltage data DVREFMIN and DVREFMAX for determining the range of phase-locking between the reproduced signal SPB and the clock signal CLK, thus offering a stable phase-lock loop operation.

The MPU 22 executes the process once a day, for example, or whenever the accumulated-error signal ERR goes beyond the threshold level ERRTH. This repeated process offers a phase-lock loop operation with a stable operating point and with a good performance which would otherwise be degraded with time, for example.

In this embodiment, the steps from STEP S11 to STEP S14 and the steps from STEP S15 to STEP S18 shown in FIG. 2 can be reversed. Moreover, the value obtained in STEP S19 is preferably the average of the maximum and minimum reference voltage data DVERMAX and DVERMIN. However, this is not a must. Any value close to the average is applicable.

As described above, the present invention provides a clock signal generating apparatus with a phase-lock loop circuitry that phase-locks an input digital signal with a clock signal. Errors occurred on the input digital signal is accumulated. The operating point of a voltage-controlled oscillator in the phase-lock loop circuitry is adjusted according to the accumulated errors.

This adjustments offers a stable operating point for a constant performance of the phase-lock loop circuitry.

What is claimed is:

1. An apparatus for generating a clock signal comprising:
    a phase comparator to compare, in phase, an input digital signal with a clock signal that has already been generated;
    a differential amplifier to amplify the difference between the output of the phase comparator and a reference voltage;
    a first generator to generate a clock signal to be supplied to the phase comparator, based on the amplified difference;
    a detector to detect errors of the input digital signal;
    an accumulator to accumulate an amount of errors detected by the detector; and
    a second generator to generate a reference voltage to be supplied to the differential amplifier within a range from a predetermined minimum voltage to a predetermined maximum voltage, a level of the generated reference voltage being adjusted according to the output of the accumulator, an operating point of the first generator being controlled by the level-adjusted reference voltage.

2. The apparatus according to claim 1, wherein the second generator includes a processor that sets a reference digital voltage data for the reference voltage at a first digital voltage data corresponding to the predetermined minimum voltage, increases the reference digital voltage data set at the first digital voltage data by a predetermined amount repeatedly until the accumulated errors reach a first level smaller than a predetermined threshold level, to find a second digital voltage data that corresponds to the first level, sets the reference digital voltage data at a third digital voltage data corresponding to the predetermined maximum voltage, decreases the reference digital voltage data set at the third digital voltage data by the predetermined amount repeatedly until the accumulated errors reach a second level smaller than the predetermined threshold level, to find a fourth digital voltage data that corresponds to the second level, obtains an average data of the second and fourth voltage data, and sets the reference voltage at a voltage corresponding to the average data.

3. A method of generating a clock signal comprising the steps of:

comparing, in phase, an input digital signal with a clock signal that has already been generated, the input digital signal being generated based on the clock signal;

amplifying the difference between the comparison result and a reference voltage;

generating a clock signal to be supplied for the comparison, based on the amplified difference;

detecting errors of the input digital signal;

accumulating an amount of the detected errors; and generating a reference voltage to be supplied for the amplification within a range from a predetermined minimum voltage to a predetermined maximum voltage, a level of the generated reference voltage being adjusted based on the accumulated errors, an operating point for the clock signal generation being controlled by the level-adjusted reference voltage.

4. The method according to claim 3, wherein the reference voltage generating step further comprises the steps of:

setting a reference digital voltage data for the reference voltage at a first digital voltage data corresponding to the predetermined minimum voltage;

increasing the reference digital voltage data set at the first digital voltage data by a predetermined amount repeatedly until the accumulated errors reach a first level smaller than a predetermined threshold level, to find a second digital voltage data that corresponds to the first level;

setting the reference digital voltage data at a third digital voltage data corresponding to the predetermined maximum voltage;

decreasing the reference digital voltage data set at the third digital voltage data by the predetermined amount repeatedly until the accumulated errors reach a second level smaller than the predetermined threshold level, to find a fourth digital voltage data that corresponds to the second level;

obtaining an average data of the second and fourth voltage data; and setting the reference voltage at a voltage corresponding to the average data.

* * * * *